United States Patent [19]

Shackle et al.

[11] Patent Number: 4,528,462
[45] Date of Patent: Jul. 9, 1985

[54] INTEGRATED CIRCUIT SWITCH USING STACKED SCRS

[75] Inventors: Peter W. Shackle, Melbourne; Robert S. Pospisil, Palm Bay, both of Fla.

[73] Assignee: Harris Corporation, Melbourne, Fla.

[21] Appl. No.: 460,020

[22] Filed: Jan. 21, 1983

Related U.S. Application Data

[63] Continuation-in-part of Ser. No. 414,862, Sep. 9, 1982.

[51] Int. Cl.³ .................................................. H03K 17/72
[52] U.S. Cl. .......................... 307/252 L; 307/252 Q; 307/303
[58] Field of Search .......... 307/252 L, 252 N, 252 W, 307/303, 252 K, 252 Q; 357/38, 49

[56] References Cited

U.S. PATENT DOCUMENTS

| | | | |
|---|---|---|---|
| 3,254,236 | 5/1966 | Meng | 307/252 L |
| 3,348,063 | 10/1967 | Bray | 307/252 W |
| 3,585,403 | 6/1971 | Gribbons | 307/252 L |
| 3,940,683 | 2/1976 | Blauschild . | |

*Primary Examiner*—John Zazworsky
*Attorney, Agent, or Firm*—Barnes & Thornburg

[57] ABSTRACT

An integrated circuit switch having a pair of serially connected SCRs with diodes connecting the gates of the SCRs to independent biasing and switching sources such that the second SCR is gated on first to enable the gating of the first SCR in the series connection. A switch controls the state of the second SCR.

9 Claims, 5 Drawing Figures

INTEGRATED CIRCUIT SWITCH USING STACKED SCRS

RELATED APPLICATION

This is a continuation-in-part of U.S. patent application Ser. No. 414,862 filed Sept. 9, 1982.

BACKGROUND OF THE INVENTION

The present invention relates generally to high voltage semiconductor switches and, more specifically, to an integrated high voltage capacity semiconductor switch.

With increased use of integrated circuits in high voltage environments, integrated circuits are required to have greater voltage handling capacity. Specifically, integrated circuit motor controls have been developed and, consequently, the switching circuitry must be capable of handling at one point as much as 400 volts. The ability to handle these voltages with discrete components is well-known in the prior art. There is a great need presently to develop integrated circuits which perform the function of discrete device circuits and components. It is well-known in the prior art to stack or connect in series a pair of silicon controlled rectifiers (SCR) in order to handle voltages greater than the capacity of a single SCR component. The control of these discrete SCR's is well-known and will not be discussed herein in detail. The problem lies in incorporating the stacked SCR principle into an integrated circuit.

SUMMARY OF THE INVENTION

An object of the present invention is to provide a stacked silicon controlled rectifier configuration in an integrated circuit.

Another object of the present invention is to provide a semiconductor switch which is capable of handling high voltages.

A further object of the present invention is to provide a bidirectional high voltage semiconductor integrated switch.

An even further object of the present invention is to provide a high voltage integrated circuit switch having reduced sensitivity.

These and other objects of the present invention are achieved by using a pair of series connected SCR's connected between two points in an integrated circuit which experience high voltages. A biasing terminal is connected to the gate of the first SCR by a first diode. A switch means is connected to the gate of the second SCR and is responsive to a switching signal to gate the second SCR in the switching means first switch state and to maintain the second SCR in the switching means second switch state. With the required high voltage applied across the two terminals, a biasing voltage applied to the biasing terminal and the switch means in its first state, the second SCR is gated on. This forward biases the first diode to enable the first SCR to be gated by the biasing potential. The switching means may be a current source connected to the gate of the second SCR on and a transistor connected between the gate of the second SCR and the second terminal. The transistor is responsive to the switching signal to prevent the second SCR from turning on and alternatively to permit the current source to gate the SCR on. The switching means may also be a second diode connected between the biasing terminal and the gate of the second SCR and the switching signal is applied to the biasing terminal as a switching signal and as a biasing potential.

The stacked diodes are unidirectional and can be made to form a bidirectional switch by placing the stacked SCR's and the circuits just described in the center of a four legged diode bridge. The opposed legs of the diode bridge will conduct alternately depending upon the polarity of the input signals through the unidirectional SCR's to provide bidirectional current through the opposed terminals. Another bidirectional arrangement is to connect two of the unidirectional stacked diode circuits each between a common point and a respective point of a pair of opposite polarity points. The unidirectional circuits are activated such that only one circuit at a time is connecting the common point to their respective polarity point.

Other objects, advantages and novel features of the present invention will become evident upon review of the description of the preferred embodiments when considered in conjunction with the accompanying drawings.

DESCRIPTION OF THE PREFERRED EMBODIMENTS

Figure 1:
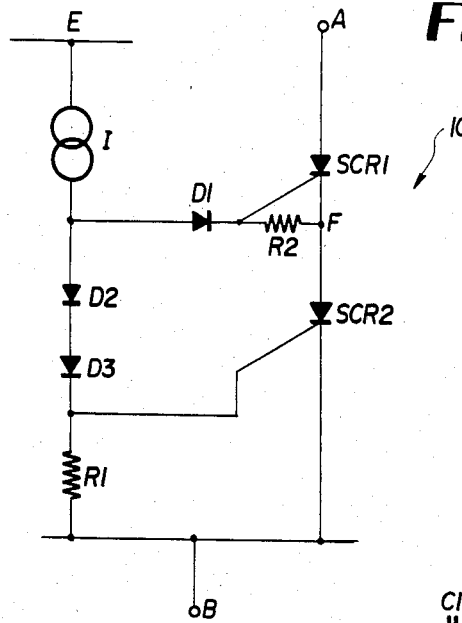
FIG. 1 is an integrated switch incorporating the principles of the present invention.

An integrated circuit switch incorporating the principles of the present invention is illustrated in FIG. 1 as 10. The switch 10 includes terminals A and B which are two points to be interconnected in an integrated circuit and across which a very high voltage appears. The other terminal of switch 10 is a biasing or switching terminal E. The switch 10 includes a pair of serial connected silicon controlled rectifiers SCR 1 and SCR 2. The anode of SCR 1 is connected to terminal A, the cathode of SCR 1 is connected to the anode of SCR 2 and the cathode of SCR 2 is connected to terminal B. The juncture of the cathode of SCR 1 and the anode of SCR 2 is denoted by the letter F.

Connected to the biasing or switching terminal E is a current source I. The gate of SCR 1 is connected to the current source I by diode D1 having its anode connected to the current source I and its cathode connected to the gate of SCR 1. The gate of SCR 2 is connected to current source I by a pair of serially connected diodes D2 and D3. The anode of D2 is connected to the current source I, its cathode connected to the anode of diode D3 and the cathode of D3 is connected to the gate of SCR 2. A resistor R1 connects the cathode of diode D3 to the terminal B. A resistor R2 connects the cathode of diode D1 to point F which is the juncture of the SCR 1 and SCR 2. The function of resistors R1 and R2 is to shunt the gates of the SCR's and, thus, to permit control of the gate sensitivity and transient voltage sensitivity of the SCR's.

In normal operation, the voltage appearing across terminals A and B is very high with terminal A being positive with respect to terminal B. This voltage can be greater than the individual breakdown voltages of SCR 1 and SCR 2, but should not exceed the sum of breakdown voltages. Initially, SCR 1 and SCR 2 are not conducting or on. With the biasing or switching voltage applied to terminal E, and SCR 1 and SCR 2 not conducting, point F is at a very high potential. Consequently, D1 is reversed-biased. With the presence of a biasing voltage on E, the current source I provides a biasing current through D2, D3 and R1 to gate SCR 2 on. Once SCR 2 is gated on, the voltage on point F is brought down to substantially that of terminal B. This forward biases diode D1 which in turn gates SCR 1 on using the current from current source I. Thus, points A and B are interconnected by the activated devices SCR 1 and SCR 2. The voltage capability of the pair is greater than the single device and, thus, allows interconnection of two points of very high potential in an integrated circuit.

Figure 2:
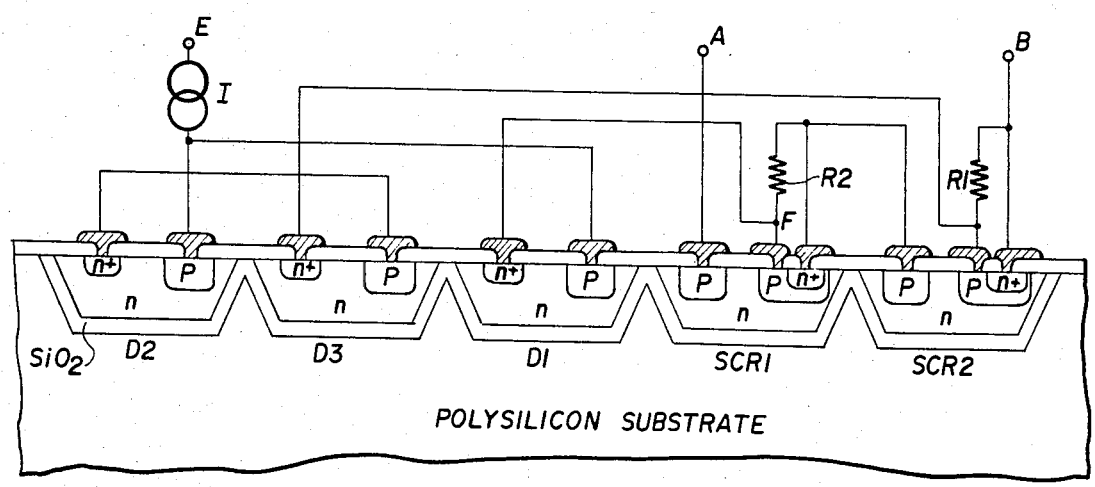
FIG. 2 is a cross-section of a substrate incorporating the integrated switch of FIG. 1.

The integration of the switch 10 of FIG. 1 into a single substrate is illustrated in FIG. 2. The SCR's SCR 1 and SCR 2 and the diodes D1, D2 and D3 are each formed in individually dielectrically isolated islands in the single substrate. The interconnections are schematically shown and may be represented by surface conductors. The resistors R1 and R2 are also schematically shown and may be formed as surface conductors or as diffused resistors. The current source I is illustrated schematically also and may be built in a dielectrically isolated island in the substrate.

The details of the construction of the integrated circuit and method of making are well-known and, thus, will not be described in detail. The purpose of FIG. 2 is to illustrate that the switch of circuit 10 can be readily formed as an integrated circuit having the voltage capacity described above. It should be noted, however, that diodes D1, D2 and D3 can be identical and formed by the same process steps. This minimizes any mismatch and simplifies the fabrication process.

Figure 3:
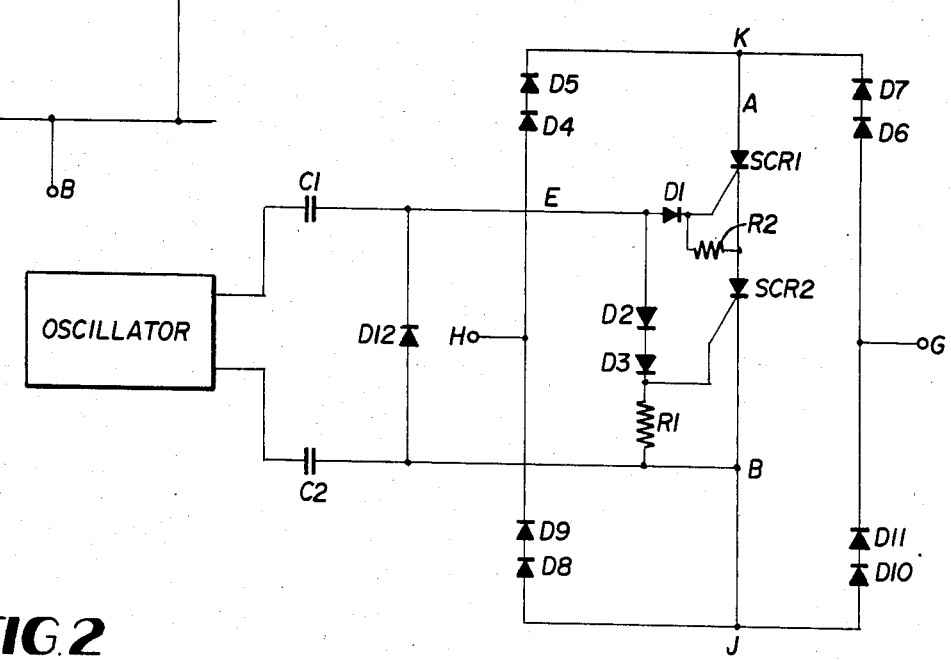
FIG. 3 is a bidirectional integrated circuit switch incorporating the principles of the present invention.

The switch 10 of FIG. 1 is a unidirectional switch and can only handle a more positive voltage at point A relative to terminal B. The adaptation of switch 10 to form a bidirectional integrated circuit switch is illustrated in FIG. 3. As in FIG. 1, the unidirectional switch 10 in FIG. 2 includes SCR 1 and SCR 2 connected between terminals A and B and diodes D1, D2, D3 connected between point E and the gates of the respective SCRs and resistor R1. The resistor R2 between the cathode of D1 and the cathode of SCR 1 can be deleted to maximize gate sensitivity since R1, D2 and D3 already shunt the gate of SCR 1 and the alternate shunt path prevents SCR 1 from being indefinitely sensitive. R1 could be eliminated if desired to make SCR 2 ultra sensitive. A diode bridge is provided with opposed terminals G and H connected to the points in the circuit to which are applied high alternating current voltages. The unidirectional switch 10 of FIG. 1 is connected to the other pair of opposed terminals J and K of the bridge.

The diode bridge includes series connected diodes D4 and D5 as a first leg connected between terminals H and K, a pair of series connected diodes D6 and D7 as a second leg connected between terminals G and K, a pair of series connected diodes D8 and D9 as a third leg connected between terminals J and H and series connected diodes D10 and D11 as fourth legs connected between terminals J and G. Each leg of the bridge has two diodes so that the voltage handling capability of the diode bridge is double that which it would be with only one diode in each leg. The diodes D4 through D11 are connected such that only a pair of opposed legs of the bridge are conducting at one time. As will be evident from the description of the circuit below, even though the direction of the current through the bridge between terminals G and H is reversed, the flow of current between terminals J and K is always the same or unidirectional.

The source of biasing, in the example illustrated in FIG. 3, connected to point E is an oscillator capacitively coupled through capacitors C1 and C2 and diode D12 to the point E and to the common terminal B of the cathode of SCR 2 and a resistor R1.

The operation of the bidirectional switch of FIG. 3 will now be explained. With terminal H of the bridge positive with respect to terminal G, diodes D4 and D5 and diodes D10 and D11 of the opposed leg of the bridge are forward-biased providing a conduction path between terminals H to K and J to G. The high frequency alternating current signal from the oscillator is rectified by diode D12 so that the required positive potential appears on terminal E to drive the gates of the SCRs. The SCRs are switched onto their conducting state by the application of the AC signal. The capacitors C1 and C2 allow the potential of the SCR switch circuit to be greatly different to that of the oscillator since they provide DC isolation between the two circuits. The unidirectional switch 10 operates as described for FIG. 1 with SCR 2 being gated on first followed by SCR 1 to provide a unidirectional flow between terminals K and J. Thus, the current flow through the bridge is from terminal H to terminal J to terminal G.

With the reversal of the potential at terminals H and G, the SCRs 1 and 2 are turned off. When terminal G has a higher potential than that at terminal H of the bridge, diodes D6 and D7 are forward-biased and opposed diodes D8 and D9 are forward-biased providing conduction path between terminals G and K and between terminals J and H. The unidirectional switch 10 is operated first gating on SCR 2 and then SCR 1 to provide a unidirectional flow between terminals K and J. Thus, the current flow through the bridge is from terminal G to terminal K to terminal J to terminal H. Thus, it is evident that the unidirectional switch 10 of FIG. 1 by being incorporated into a diode bridge is converted to a bidirectional switch having the capability to handle bidirectional high value voltages.

In one application, the terminals H and G may be connected to the gate and anode, respectively, of a triac which controls a motor or other line power load.

Figure 4:
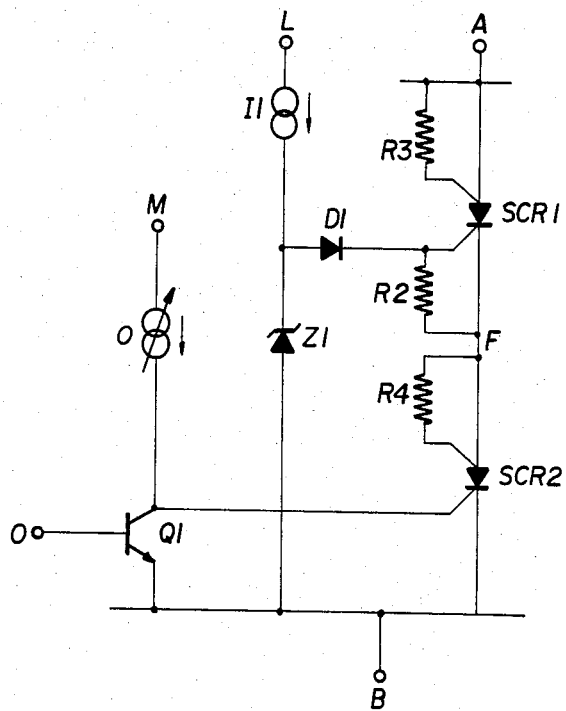
FIG. 4 is another integrated switch incorporating the principles of the present invention.

Another embodiment of a unidirectional high voltage integrated switch is illustrated in FIG. 4. The switch includes a pair of serial connected silicon controlled rectifiers SCR 1 and SCR 2 wherein anode of SCR 1 is connected to terminal A, the cathode of SCR 1 is connected to the anode of SCR 2 and the cathode of SCR 2 is connected to terminal B. The juncture of the cathode of SCR 1 and the anode of SCR 2 is denoted by the letter F.

The gate of SCR 1 is connected by a diode D1 to a first current source $I_1$, which is connected to a first biasing terminal. A zener diode $Z_1$ connects the current source $I_1$ to the point B. When the diode D1 is reversed biased, the zener diode $Z_1$ is maintained at its breakdown voltage and the output of the current source $I_1$ with a biasing potential continuously applied at terminal L is carried to terminal B by zener diode $Z_1$. The gate of SCR 2 is connected to a second current source $I_2$ which is connected to a second biasing terminal M. A switch, illustrated as a NPN transistor $Q_1$, connects the second current source $I_2$ and the gate of SCR 2 to terminal B and is responsive to a switching signal on switching terminal O. When switch $Q_1$ is on, it connects the gate of SCR 2 to terminal B thereby preventing the current source $I_2$ or any other signal from gating SCR 2 on. When switch $Q_1$ is off and a biasing potential is applied to terminal M, the current source $I_2$ gates SCR 2 on.

A resistor R2 connects the cathode of diode D1 and the P gate of SCR 1 to point F. A resistor R3 connects the N gate of SCR 1 to terminal A. A resistor R4 connects the N gate of SCR 2 to point F. The function of resistors R2, R3 and R4 is to shunt the gates of the SCR's and, thus, to permit control of the gate sensitivity and transient voltage sensitivity of the SCR's.

In normal operation, the voltage appearing across terminals A and B is very high with terminal A being positive with respect to terminal B. Initially, biasing potential is continuously applied to terminal L and the current provided by current source $I_1$ is shunted to terminal B by zener diode Z1 and a switching signal is applied to terminal O to turn on transistor $Q_1$ to shunt the gate of SCR 2 to terminal B. If a biasing potential is continuously applied to terminal M, the transistor $Q_1$ must be sufficiently large to carry the output of current source $I_2$. Alternatively and preferably, the biasing signal applied to terminal M is not continuously applied and is only applied when transistor $Q_1$ is off to gate on SCR 2. Initially SCR 1 and SCR 2 are not conducting and point F is at high potential. Consequently, D1 is reversed biased.

When the switching signal on terminal O turns transistor $Q_1$ off and the biasing voltage is applied to terminal M, current source $I_2$ gates SCR 2 on. Once SCR 2 is gated on, the voltage on point F is brought down to substantially that of terminal B. This forward biases diode D1 which in turn gates SCR 1 on using the current from current source $I_1$. Thus, points A and B are interconnected by the activated devices SCR 1 and SCR 2. The voltage capability of the pair is greater than the single device and, thus, allows interconnection of two points of very high potential in an integrated circuit.

In comparison to FIG. 1, the embodiment of FIG. 4 uses a switch $Q_1$ instead of an impedance R1 to assure that the SCR 2 is not gated on accidentally. Also by using a switch instead of an impedance, the current source can be decreased since it only sees the impedance of the SCR. The biasing and switching terminal E of FIG. 1 is replaced by a continuous biasing terminal L, a biasing and preferably a switching terminal M and a switching terminal O.

Figure 5:
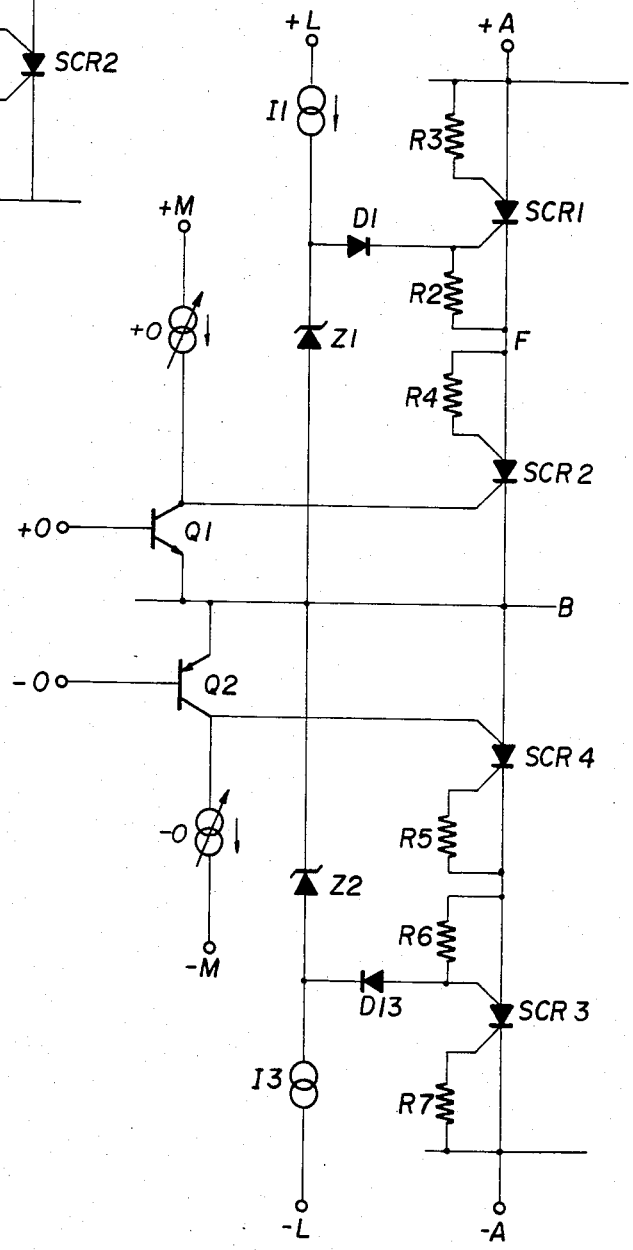
FIG. 5 is another bidirectional integrated circuit switch incorporating the principles of the present invention.

Another embodiment of a bidirectional switch using two unidirectional switches of FIG. 4 is illustrated in FIG. 5. The first unidirectional switch including SCR 1 and SCR 2, current sources $I_1$ and $I_2$, diodes D1 and Z1, transistor $Q_1$ and resistors R2, R3 and R4 control the interconnection of terminals +A and +B using biasing at terminals +L and +M and switching terminal +O. The first unidirectional switch controls the positive cycle of the combined bidirectional switch.

A second unidirectional switch includes a pair of series connected silicon controlled rectifiers SCR 3 and SCR 4 with the anode of SCR 4 connected to terminal B and the cathode of SCR 3 connected to terminal −A.

A current source $I_3$, which is biased by a voltage of biasing terminal −L, is connected to the N gate of SCR 3 by diode D13 and to terminal B by zener diode $Z_2$. A current source $I_4$, which is biased by a voltage at biasing terminal −M, is connected to the N gate of SCR 4 and to terminal B by switch $Q_2$, which is controlled by switching signal at terminal −O. A resistor R5 connects the P gate of SCR 4 to its cathode, resistor R6 connects the N gate of SCR 3 to its anode and resistor R7 connects the P gate of SCR 3 to its cathode. The second unidirectional switch operates identically to the first unidirectional switch except that the N gate of the SCRs are used to gate on the SCRs to control the negative half cycle of the combined bidirectional switch.

It should be noted that the negative notation for the terminals of the second unidirectional switch is an indication that the voltages to be applied are negative with respect to terminal B and not the inverse of the signals applied to the terminals of the first unidirectional switch. A pair of unidirectional switches of FIG. 1 wherein the negative cycle unidirectional switch uses the N gate of the SCRs may be used in the directional switch of FIG. 5 as was a pair of unidirectional switches of FIG. 4.

As is evident from the description of the preferred embodiments, the objects of the invention are attained in that an integrated circuit switch capable of handling high voltages is provided. Although the invention has been described and illustrated in detail, it is clearly understood that the same is by way of illustration and example only and is not to be taken by way of limitation. Although the stacked gated rectifiers are illustrated as silicon controlled rectifiers, it is evident that other types of gated rectifiers or thyristors such as TRIACS, GTO's and ASCR's may be used. The spirit and scope of the present invention are to be limited by the terms of the appended claims.

What is claimed is:

1. An integrated circuit switch for interconnecting a pair of points in a circuit comprising:
    a first and second terminal for connecting to said pair of points in a circuit;
    first and second thyristors having main electrodes serially connected to one another, said first thyristor having a main electrode connected to said first terminal and said second thyristor having a main electrode connected to said second terminal;
    a switchable means connected to the gate of said second thyristor and having a first and second state in response to a switching signal for gating said second thyristor on in said first state and for maintaining said second thyristor off in said second state;
    a third terminal for receiving a biasing potential;
    a first diode means connecting said third terminal to the gate of said first thyristor for becoming forward biased and gating said first thyristor on by said biasing potential when a voltage less than the sum of a breakdown voltage of said first and second thyristors is applied across the first and second terminals and said second thyristor is gated on.

2. The integrated circuit switch according to claim 1 wherein said switchable means includes a current source connected to the gate of said second thyristor and a transistor connected between the gate of said second thyristor and said second terminal and responsive to said switching signal to prevent gating of said second thyristor on when said transistor is on and to permit said current source to gate said second thyristor on when said transistor is off.

3. The integrated circuit switch according to claim 2 wherein said current source is switchable and responsive to said switching signal such that said current source is on when said transistor is off and off when said transistor is on.

4. The integrated circuit switch according to claim 2 including a second current source between said third terminal and said first diode means and a zener diode between the intersection of said first diode means and said second current source and said second terminal.

5. A bidirectional integrated circuit switch for selectively interconnecting a first point and a second point to a third point in a circuit comprising:
 a first unidirectional switch means for controlling the connection of said first point to said third point and a second unidirectional switch means for controlling the connection of said second point to said third point;
 each unidirectional switch means including:
 (a) first and second thyristors having main electrodes serially connected to one another, each of said first thyristors having a main electrode connected to said first point and to said second point, respectively, and each of said second thyristors having a main electrode connected to said third point;
 (b) switchable means connected to the gate of said second thyristor and having a first and second states in response to a switching signal for gating said second thyristor on in said first state and for maintaining said second thyristor off in said second state;
 (c) biasing terminal for receiving a biasing potential;
 (d) a first diode means connecting said biasing terminal to the gate of said first thyristor for becoming forward biased and gating said first thyristor on by said biasing potential when a voltage less than the sum of a breakdown voltage of both said first and second thyristor is applied across said first or second and said third terminals and said second thyristor is gated on.

6. A bidirectional integrated circuit switch according to claim 5 including means for generating a first switching signal for said first unidirectional switching means and a second switching signal for said second unidirectional means, said first and second switch signals switch only one of said switchable means to a first state at a time.

7. A bidirectional integrated circuit switch according to claim 5 wherein each of said switchable means includes a current source connected to the gate of said second thyristor and a transistor connected between the gate of said second thyristor and said third point and responsive to said switching signal to prevent gating of said second thyristor on when said transistor is on and to permit said current source to gate said second thyristor on when said transistor is off.

8. A bidirectional integrated circuit switch according to claim 7 wherein said current source is switchable and responsive to said switching signal such that said current source is on when said transistor is off and off when said transistor is on.

9. A bidirectional integrated circuit switch according to claim 5, wherein each unidirectional switch means further includes a second current source between said biasing terminal and said first diode means and a zener diode between the intersection of said first diode means and said second current source and said third point.

* * * * *